(12) United States Patent
Hashimoto et al.

(10) Patent No.: US 9,921,654 B2
(45) Date of Patent: Mar. 20, 2018

(54) TACTILE SENSE PRESENTATION DEVICE

(71) Applicant: Murata Manufacturing Co., Ltd., Nagaokakyo-shi, Kyoto-fu (JP)

(72) Inventors: Junichi Hashimoto, Nagaokakyo (JP); Kentaro Usui, Nagaokakyo (JP); Masamichi Ando, Nagaokakyo (JP)

(73) Assignee: MURATA MANUFACTURING CO., LTD., Nagaokakyo-shi, Kyoto-Fu (JP)

( * ) Notice: Subject to any disclaimer, the term of this patent is extended or adjusted under 35 U.S.C. 154(b) by 191 days.

(21) Appl. No.: 15/086,443

(22) Filed: Mar. 31, 2016

(65) Prior Publication Data
US 2016/0209926 A1 Jul. 21, 2016

Related U.S. Application Data (63) Continuation of application No. PCT/JP2014/076754, filed on Oct. 7, 2014.

(30) Foreign Application Priority Data

Oct. 8, 2013 (JP) .................................. 2013-210816
Jun. 20, 2014 (JP) .................................. 2014-127138

(51) Int. Cl.
*G06F 3/01* (2006.01)
*G06F 3/041* (2006.01)
(Continued)

(52) U.S. Cl.
CPC ............ *G06F 3/016* (2013.01); *G06F 3/0202* (2013.01); *G06F 3/0219* (2013.01); *G06F 3/041* (2013.01);
(Continued)

(58) Field of Classification Search
CPC ...... G06F 3/016; G06F 3/0202; G06F 3/0219; G06F 3/041; G06F 3/0416;
(Continued)

(56) References Cited

U.S. PATENT DOCUMENTS 4,820,952 A * 4/1989 Lee ........................... H04R 7/04
310/322
6,343,129 B1 * 1/2002 Pelrine ................... F04B 35/045
381/116

(Continued)

FOREIGN PATENT DOCUMENTS

JP 2005267058 A 9/2005
JP 2005303937 A 10/2005
(Continued)

OTHER PUBLICATIONS

International Search Report issued for PCT/JP2014/076754, dated Dec. 9, 2014.
(Continued)

*Primary Examiner* — Michael J Eurice
(74) *Attorney, Agent, or Firm* — Arent Fox LLP (57) ABSTRACT

A tactile sense presentation device that includes a film member which deforms in a planar direction when a voltage is applied thereto, a diaphragm fixed to the film member in a state where a bending stress is applied to the diaphragm, a touch detector which detects a touch operation, and a voltage driver which applies a drive signal to the film member when the touch detector detects the touch operation.

15 Claims, 10 Drawing Sheets

(51) Int. Cl.
| | |
|---|---|
| H04R 17/00 | (2006.01) |
| H04R 7/10 | (2006.01) |
| H04R 7/18 | (2006.01) |
| H04R 7/00 | (2006.01) |
| H04R 17/02 | (2006.01) |
| G06F 3/02 | (2006.01) |
| G06F 3/0488 | (2013.01) |
| H01L 41/09 | (2006.01) |
| H04R 7/04 | (2006.01) |
| H04R 17/04 | (2006.01) |

(52) U.S. Cl.
CPC ........ *G06F 3/0416* (2013.01); *G06F 3/04886* (2013.01); *H01L 41/0986* (2013.01); *H04R 7/00* (2013.01); *H04R 7/10* (2013.01); *H04R 7/18* (2013.01); *H04R 17/005* (2013.01); *H04R 17/025* (2013.01); *G06F 2203/04102* (2013.01); *G06F 2203/04103* (2013.01); *H04R 7/045* (2013.01); *H04R 17/04* (2013.01); *H04R 2307/025* (2013.01); *H04R 2499/15* (2013.01)

(58) Field of Classification Search
CPC ....... G06F 3/04886; G06F 2203/04102; G06F 2203/04103; H01L 41/0986; H04R 7/10; H04R 7/18; H04R 7/045; H04R 17/00; H04R 17/005; H04R 17/025; H04R 17/04; H04R 2307/025; H04R 2499/15
See application file for complete search history.

(56) References Cited

U.S. PATENT DOCUMENTS

| | | | | |
|---|---|---|---|---|
| 6,376,971 | B1* | 4/2002 | Pelrine | F04B 35/00 310/363 |
| 6,545,384 | B1* | 4/2003 | Pelrine | F02G 1/043 310/309 |
| 6,781,284 | B1* | 8/2004 | Pelrine | F04B 35/00 310/330 |
| 7,034,432 | B1* | 4/2006 | Pelrine | F02G 1/043 310/309 |
| 2001/0026626 | A1* | 10/2001 | Athanas | H04R 17/00 381/190 |
| 2002/0050769 | A1* | 5/2002 | Pelrine | F04B 35/00 310/363 |
| 2002/0122561 | A1* | 9/2002 | Pelrine | F04B 35/045 381/191 |
| 2003/0052570 | A1* | 3/2003 | Kirjavainen | H04R 7/02 310/311 |
| 2003/0214199 | A1* | 11/2003 | Heim | F04B 35/045 310/309 |
| 2004/0232807 | A1* | 11/2004 | Pelrine | F04B 35/00 310/330 |
| 2006/0097996 | A1* | 5/2006 | Tabata | G06F 3/016 345/173 |
| 2007/0097073 | A1* | 5/2007 | Takashima | G06F 3/016 345/156 |
| 2008/0218031 | A1* | 9/2008 | Kuroda | H04R 17/10 310/334 |
| 2008/0245985 | A1* | 10/2008 | Heim | F16K 99/0001 251/129.06 |
| 2009/0189873 | A1* | 7/2009 | Peterson | G06F 3/016 345/173 |
| 2009/0244021 | A1* | 10/2009 | Matsuo | G06F 3/044 345/173 |
| 2010/0171715 | A1* | 7/2010 | Peterson | G06F 3/016 345/173 |
| 2011/0102341 | A1* | 5/2011 | Imai | G06F 1/1626 345/173 |
| 2011/0109204 | A1* | 5/2011 | Tajitsu | H01L 41/193 310/348 |
| 2012/0162143 | A1* | 6/2012 | Kai | G06F 1/1626 345/177 |
| 2012/0268386 | A1* | 10/2012 | Karamath | G06F 3/016 345/173 |
| 2013/0057499 | A1* | 3/2013 | Ando | G06F 3/038 345/173 |
| 2013/0307789 | A1* | 11/2013 | Karamath | G06F 3/016 345/173 |
| 2014/0002427 | A1* | 1/2014 | Yeo | G06F 1/1601 345/204 |
| 2014/0028157 | A1* | 1/2014 | Adachi | G06F 3/016 310/366 |
| 2014/0035735 | A1* | 2/2014 | Zellers | G08B 6/00 340/407.2 |
| 2014/0079255 | A1* | 3/2014 | Ando | H04R 7/10 381/190 |
| 2014/0139328 | A1* | 5/2014 | Zellers | G06F 3/016 340/407.2 |
| 2014/0139436 | A1* | 5/2014 | Ramstein | H01L 41/193 345/168 |
| 2014/0197936 | A1* | 7/2014 | Biggs | G08B 6/00 340/407.1 |
| 2014/0232646 | A1* | 8/2014 | Biggs | G06F 3/016 345/156 |
| 2014/0347304 | A1* | 11/2014 | Ando | G06F 3/041 345/173 |
| 2015/0062458 | A1* | 3/2015 | Nakamura | G06F 3/047 349/12 |
| 2015/0154885 | A1* | 6/2015 | Livermore-Clifford | G09B 5/00 434/114 |
| 2015/0301657 | A1* | 10/2015 | Ando | G06F 3/0485 345/174 |
| 2016/0085307 | A1* | 3/2016 | Levesque | G06F 3/016 340/407.2 |
| 2016/0195994 | A1* | 7/2016 | Kitada | G06F 3/044 345/174 |

FOREIGN PATENT DOCUMENTS

| | | |
|---|---|---|
| JP | 2007122501 A | 5/2007 |
| WO | WO 2012157691 A1 | 11/2012 |
| WO | WO 2013057940 A1 | 4/2013 |
| WO | WO 2013145464 A1 | 10/2013 |

OTHER PUBLICATIONS

Written Opinion of the International Searching Authority issued for PCT/JP2014/076754, dated Dec. 9, 2014.

* cited by examiner

TACTILE SENSE PRESENTATION DEVICE

CROSS REFERENCE TO RELATED APPLICATIONS

The present application is a continuation of International application No. PCT/JP2014/076754, filed Oct. 7, 2014, which claims priority to Japanese Patent Application No. 2013-210816, filed Oct. 8, 2013, and Japanese Patent Application No. 2014-127138, filed Jun. 20, 2014, the entire contents of each of which are incorporated herein by reference.

FIELD OF THE INVENTION

The present invention relates to a tactile sense presentation device which feeds back a sense of touch by transmitting vibrations to a user.

BACKGROUND OF THE INVENTION

In recent years, tactile sense presentation devices have been proposed which each feed back a sense of touch by transmitting vibrations when a user touches a key on a touch panel keyboard, and makes the user feel that the user has "pushed" a key.

For example, Patent Literature 1 discloses a structure which holds both ends of a piezoelectric bimorph element made of piezoelectric ceramics or the like by using low elastic bodies, and connects a vibration member to a center of the piezoelectric bimorph element. The structure according to Patent Literature 1 transmits vibrations to a user via the connected vibration member by inputting an alternating-current signal to the piezoelectric bimorph element to cause vibrations.

PTL 1: Japanese Patent Application Laid-Open No. 2005-303937

SUMMARY OF THE INVENTION

However, there is a problem in that piezoelectric ceramics are likely to crack. Meanwhile, a member which is not likely to be cracked such as a film member (e.g. piezoelectric resin) which deforms in a planar direction when a voltage is applied has a low capability to transmit vibrations, and is difficult to use as a tactile sense presentation device.

It is therefore an object of the present invention to provide a tactile sense presentation device which can transmit vibrations which are strong to some degree even when a film member is used which deforms in a planar direction when a voltage is applied.

A tactile sense presentation device according to the present invention includes a film member which deforms in a planar direction when a voltage is applied thereto; a flat-shaped diaphragm which is fixed to the film member in a state where a bending stress is produced; a touch detector which detects a touch operation; and a voltage driver which applies a drive signal to the film member when the touch detector detects the touch operation.

In this tactile sense presentation device, when a user performs a touch operation, the drive signal is applied to the film member, and the film member stretches or contracts. The diaphragm vibrates in a direction orthogonal to a principal surface when the film member stretches or contracts. The diaphragm produces a bending stress and can be efficiently vibrated in response to the stretching or the contraction of the film member. Consequently, the tactile sense presentation device according to the present invention can transmit vibrations which are strong to some degree even when the film member is used which deforms in a planar direction when a voltage is applied.

In addition, according to one aspect of the present invention, the film member may be formed by only a piezoelectric film made of piezoelectric resin or may be formed by an exciter film of a flat shape which includes a principal surface to which the piezoelectric film is attached. Further, "the film member which deforms in the planar direction when a voltage is applied thereto" is not limited to a piezoelectric film. Examples of other structures include an electrostrictive film, an erectret film, a composite film or an electroactive film. The electroactive film is a film member which is electrically driven to produce a stress, or a film member which is electrically driven to be deformed and cause displacement. More specifically, examples of the electroactive film include an electrostrictive film, a composite material (a material formed by sealing piezoelectric ceramics with resin), an electrically driving elastomer or a liquid crystal elastomer.

Further, the touch detector may detect an operation of touching the diaphragm or detect a touch on a touch panel attached to the diaphragm.

Furthermore, the diaphragm may produce a bending stress when fixed to the film member in a state where the diaphragm is curved in a direction orthogonal to the principal surface of the film member, or may have a curved shape in a state where the diaphragm is not fixed to the film member and produce a bending stress when fixed to the film member such that the curved flat surface becomes flat.

Still further, the film member is not limited to one film member, and may also be divided into a plurality of film members.

Moreover, a material of the piezoelectric resin may be not only polyvinylidene fluoride but also chiral polymers. Particularly when chiral polymers are polylactic acids, it is possible to realize a tactile sense presentation device where almost all of the surfaces have high translucency, by using a material having translucency not only for tactile sense presentation device but also for other components.

According to the present invention, it is possible to transmit vibrations which are strong to some degree even when a piezoelectric resin is used.

DETAILED DESCRIPTION OF THE INVENTION

Figure 1:
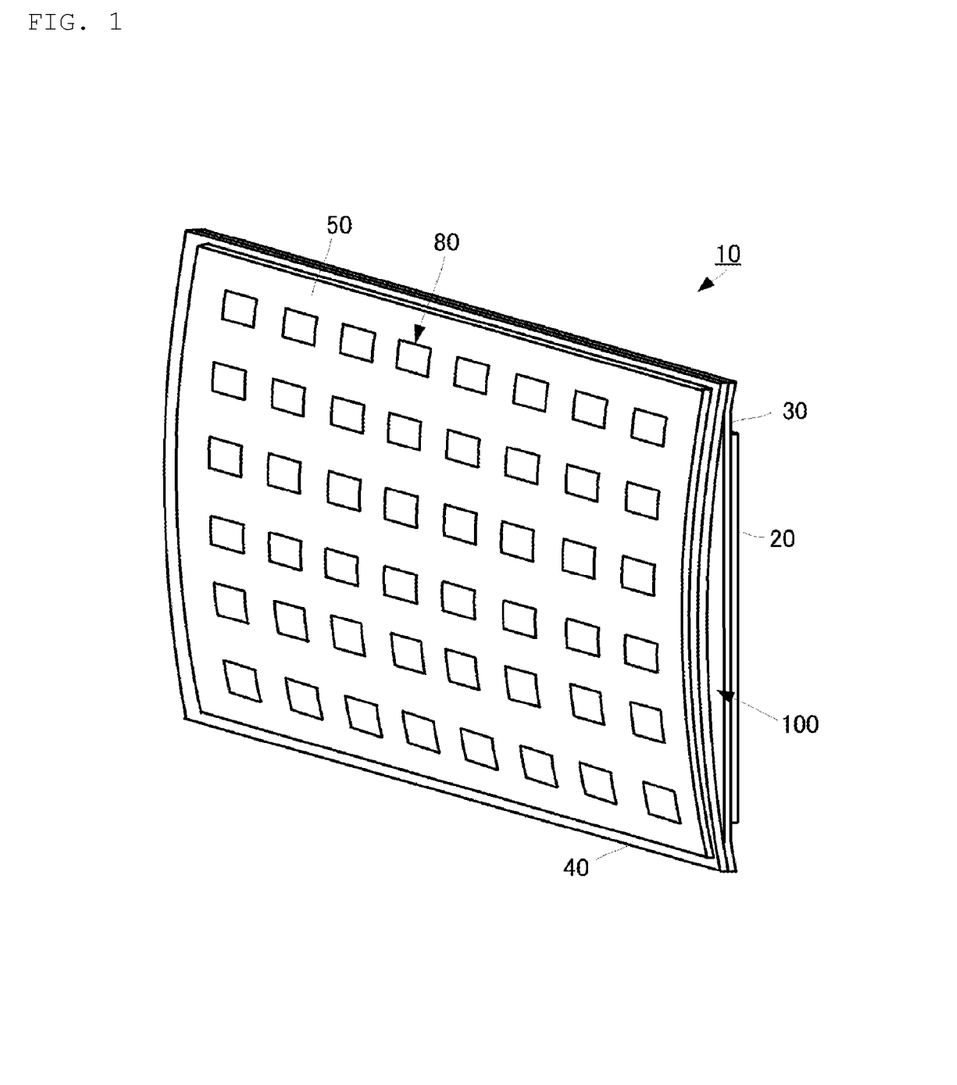
FIG. 1 is an external appearance perspective view of a tactile sense presentation device 10.
Figure 2A:
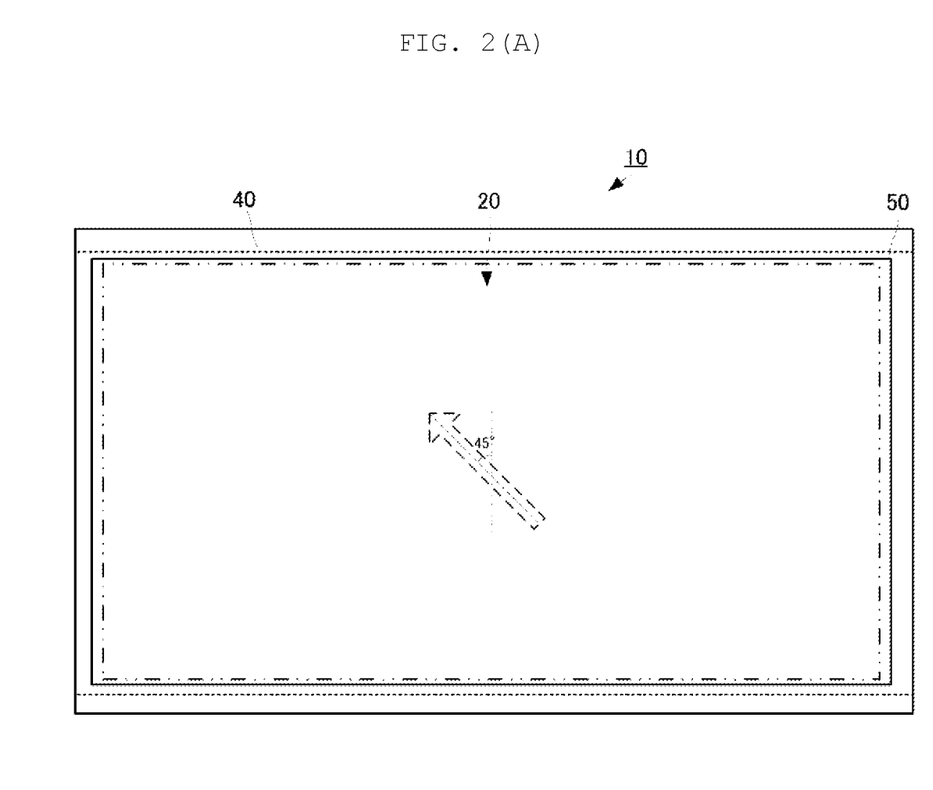
FIG. 2(A) is a front view and FIG. 2(B) is a side view of the tactile sense presentation device 10.
Figure 2B:
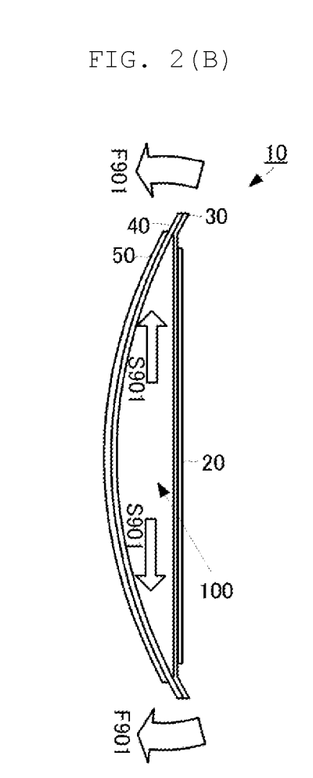

FIG. 1 is an external appearance perspective view of a tactile sense presentation device 10 according to a first embodiment. FIG. 2(A) is a front view of the tactile sense presentation device 10, and FIG. 2(B) is a side view of the tactile sense presentation device 10.

The tactile sense presentation device 10 includes a piezoelectric film 20, an exciter film 30, a diaphragm 40 and a touch panel 50. In the embodiment shown in the drawings, the tactile sense presentation device 10 is configured as a keyboard, and the touch panel 50 is provided with a plurality of touch sensors 80 at positions meeting key alignment. Each touch sensor 80 in this embodiment corresponds to a touch detector according to the present invention. Each touch sensor 80 may be any type of a touch sensor as long as the touch sensor has a function of detecting a user's touch operation, and, for each touch sensor 80, various types such as a membrane type, a capacitive-type and a piezoelectric film type can be used.

The touch panel 50 is attached to one principal surface (front surface) of the flat-shaped diaphragm 40. The diaphragm 40 has a rectangular shape when viewed in a plan view. Both ends of the diaphragm 40 in a lateral direction on the other principal surface (back surface) are fixed to the exciter film 30. The diaphragm 40 is preferably made of acrylic resin, PMMA for example.

In addition, for the diaphragm 40, other materials such as a metal plate, PET, polycarbonate (PC), and glass may be used.

In addition, the touch panel 50 can be omitted and the plurality of touch sensors 80 can be provided on the front surface of the diaphragm 40 and at positions meeting key alignment.

The exciter film 30 has a rectangular shape when viewed in a plan view similar to the diaphragm 40. The exciter film 30 is made of, for example, polyethylene terephthalate (PET). In addition, for the exciter film 30, other materials such as polyethylene naphthalate (PEN), polyethylene (PE), polypropylene (PP) and polyvinyl chloride (PVC) may be used. Further, the same material as that of the piezoelectric film 20 may be used. The exciter film 30 desirably has a thickness (e.g. about 0.02 to 0.5 mm) which does not inhibit stretching capability.

The exciter film 30 has one principal surface to which the piezoelectric film 20 is attached. In this example, the piezoelectric film 20 is attached to one of the principal surfaces of the exciter film 30 at a side opposite to a side to which the diaphragm 40 is attached, yet may be attached to the principal surface at the same side to which the diaphragm 40 is attached.

Figure 3:
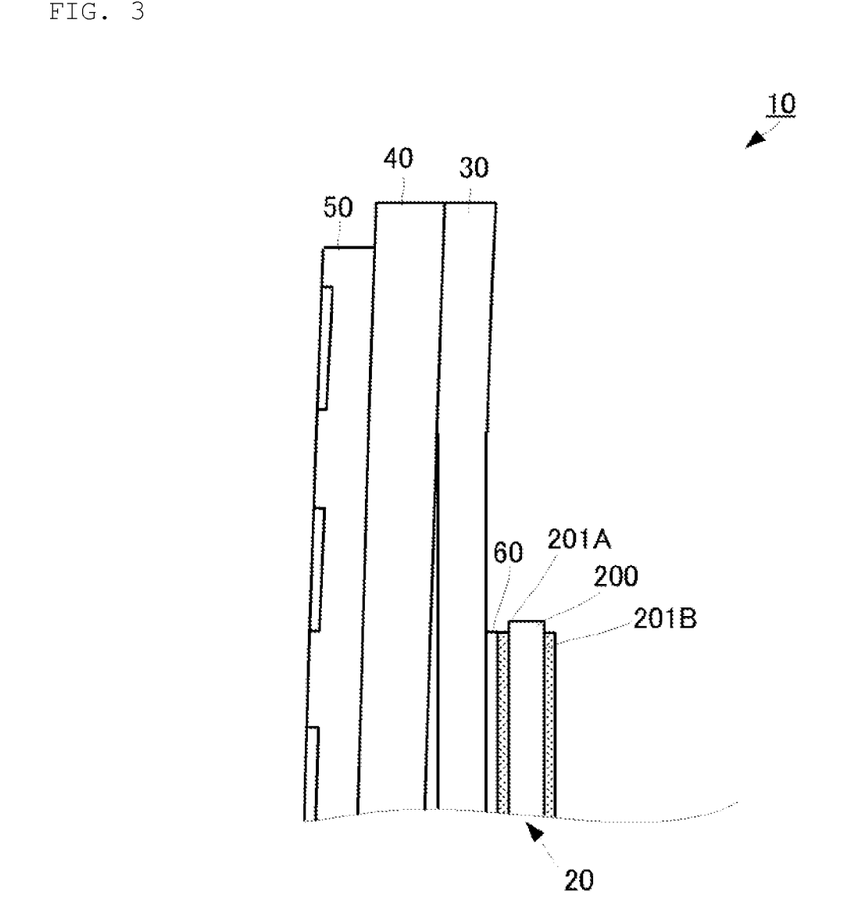
FIG. 3 is a partially enlarged side view of the tactile sense presentation device 10.

As illustrated in the partially enlarged side view of the tactile sense presentation device 10 in FIG. 3, the piezoelectric film 20 includes a base film 200 of a rectangular shape seen from a plan view, and electrodes 201A and 201B which are formed on both opposing principal surfaces of the base film 200.

The base film 200 is piezoelectric resin for which a material such as polyvinylidene fluoride (PVDF) or chiral polymers is used. More preferably, polylactic acid (PLA) having high translucency is used for the base film 200. The base film 200 is desirably made of PLLA in particular. When PLA is used, it is possible to realize the tactile sense presentation device 10 whose almost all surfaces have a high translucency, and by using a material having high translucency for other components as well. Further, PLLA does not have pyroelectricity and is not influenced by a change in an ambient temperature. Consequently, a magnitude of vibrations does not change due to a change in a temperature, heat generated by an electronic device or a change in a temperature caused by the contact of the finger.

When the base film 200 is made of PLLA, as illustrated in FIG. 2(A), the base film 200 is formed in a rectangular shape by cutting the base film 200 such that each outer circumference side forms about 45° with respect to a stretching direction to provide piezoelectricity.

The electrode 201A and the electrode 201B are formed on almost all surfaces of the both principal surfaces of the base film 200. Main components of the electrode 201A and the electrode 201B are preferably indium tin oxide (ITO), zinc oxide (ZnO) and polythiophene. In addition, for the electrode 201A and the electrode 201B, silver nanowire electrodes can also be used and, in case of a use mode which allows low translucency, aluminum deposited electrodes are preferably used. The electrode 201A and the electrode 201B are connected with an extended wiring conductor which is not illustrated, and drive signals are applied to the electrode 201A and the electrode 201B via the wiring conductor. The electrode 201A disposed at the side of the exciter film 30 is attached to the exciter film 30 via the adhesion layer 60.

Figure 4:
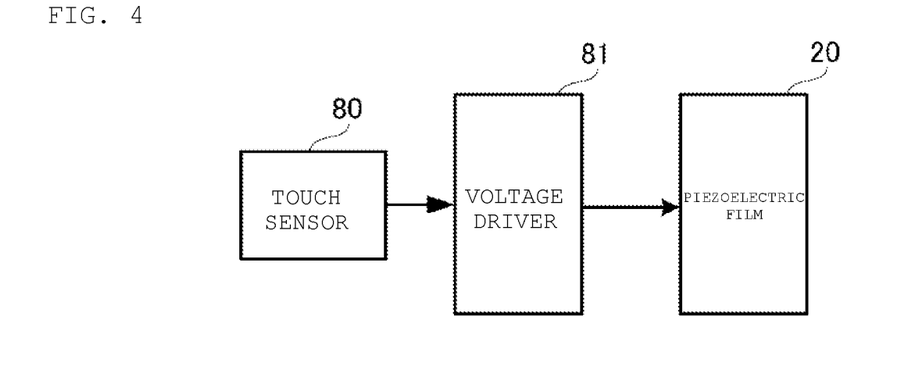
FIG. 4 is a block diagram illustrating a configuration of the tactile sense presentation device 10.

As illustrated in FIG. 4, when a user touches the touch sensor 80 provided to the touch panel 50, a voltage driver 81 applies drive signals to the electrode 201A and the electrode 201B of the piezoelectric film 20. Thus, the piezoelectric film 20 stretches or contracts. A voltage driver is a well know class of structures that, in response to an input signal, output an appropriate voltage. These structures include, for example, operational amplifiers, potentiometers, and the like.

As illustrated in FIG. 1 and FIG. 2(B), the diaphragm 40 is fixed to the exciter film 30 in such a shape that the diaphragm 40 is curved protruding toward a side (a front surface side of the diaphragm 40) opposite to a side (a back surface side of the diaphragm 40) at which the exciter film 30 is provided. According to this configuration, a hollow region 100 is formed between the diaphragm 40 and the exciter film 30. Further, the side at which this diaphragm 40 is provided is the front surface side of the tactile sense presentation device 10, and the side at which the exciter film 30 is provided is the back surface side of the tactile sense presentation device 10.

In this regard, in the present embodiment, the curved state of the diaphragm 40 is shown in an exaggerated state for ease of description. In reality, the principal surface of the diaphragm 40 and the principal surface of the exciter film 30 are desirably as parallel as possible, and the hollow region 100 is desirably as small as possible.

Thus, the diaphragm 40 is fixed to the exciter film 30 in a state where the flat surface thereof is curved, and is fixed to the exciter film 30 in a state where a bending stress is applied to the diaphragm 40 as indicated by an outlined arrow F901 in FIG. 2(B). Further, a tensile force is applied to the exciter film 30 in the lateral direction on the principal surface of the exciter film 30 as indicated by the outlined arrow S901 in FIG. 2(B).

Figure 5A:
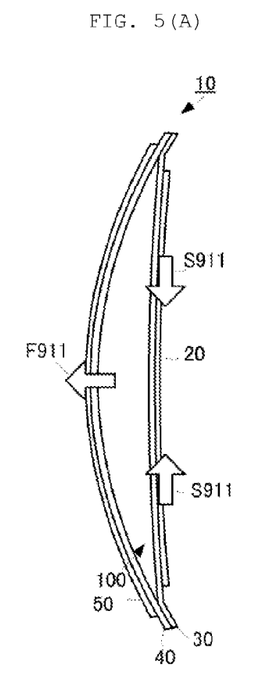
FIGS. 5(A) to 5(C) are explanatory views of an operation of the tactile sense presentation device 10.
Figure 5B:
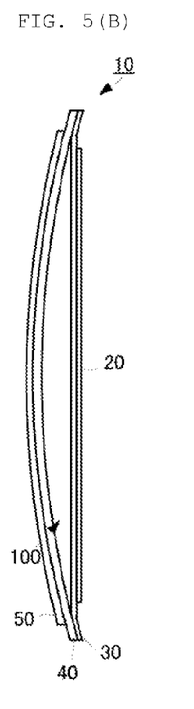
Figure 5C:
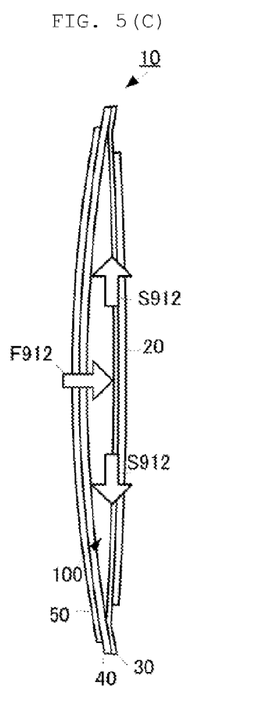

FIG. 5 is an explanatory view of an operation of the tactile sense presentation device 10, and FIG. 5(A) illustrates a state at a timing at which the piezoelectric film 20 is contracted according to a drive signal. FIG. 5(B) illustrates a state where a drive signal is not applied or an amplitude of the drive signal is 0. FIG. 5(C) illustrates a state at a timing at which the piezoelectric film 20 is stretched according to a drive signal.

When the voltage driver 81 applies the drive signal to the piezoelectric film 20 and applies an electric field in a first direction of the piezoelectric film 20, the piezoelectric film 20 contracts along a direction orthogonal to fixed ends of the diaphragm 40 and the exciter film 30 as indicated by an arrow S911 in FIG. 5(A). The piezoelectric film 20 is attached to the back surface of the exciter film 30, so that the back surface side of the exciter film 30 contracts accompanying the contraction of the piezoelectric film 20. In this case, the exciter film 30 is slightly curved toward the front surface side in a direction orthogonal to the principal surface. Further, the diaphragm 40 is pulled in a center direction from a portion (an end in the lateral direction) fixed to the exciter film 30. Thus, the diaphragm 40 is curved protruding forward as indicated by an arrow F911 in FIG. 4(A).

Meanwhile, when the voltage driver 81 applies the drive signal to the piezoelectric film 20 and applies an electric field in a second direction opposite to the first direction, the piezoelectric film 20 stretches along a direction orthogonal to fixed ends of the diaphragm 40 and the exciter film 30 as indicated by an arrow S912 in FIG. 5(C). The piezoelectric film 20 is attached to the back surface of the exciter film 30, so that the back surface side of the exciter film 30 stretches accompanying the contraction of the piezoelectric film 20. In this case, the exciter film 30 is slightly curved toward the back surface side in a direction orthogonal to the principal surface. Further, the diaphragm 40 is pulled from the center direction toward the portion (the end in the lateral direction) fixed to the exciter film 30. Thus, the diaphragm 40 is placed in a curved state where a forward protrusion amount lowers as indicated by an arrow F912 in FIG. 5(C).

Hence, the diaphragm 40 transitions to a state in FIG. 5(A) or a state in FIG. 5(C) based on a state in FIG. 5(B) according to an amplitude of the drive signal, and vibrates along a front surface direction and a back surface direction (a direction orthogonal to the principal surface of the diaphragm 40). Thus, vibrations corresponding to a drive signal are transmitted to the touch panel 50 via the diaphragm 40, and are transmitted to the user who has touched the touch panel 50. Consequently, when touching the touch sensor 80 of the touch panel 50, the user receives a feedback of vibrations and, consequently, can feel that the user has "pushed" a key.

Further, the diaphragm 40 receives a stationary bending stress in a non-operation state, and therefore a force applied to the diaphragm 40 when the piezoelectric film 20 and the exciter film 30 stretch is the same as the bending stress. Consequently, the tactile sense presentation device 10 can efficiently vibrate the diaphragm 40, and transmit vibrations which are strong to some degree even when the piezoelectric film is used. Further, it is possible to make the tactile sense presentation device 10 thin compared to vibrations caused by a motor or the like.

In addition, by filling soft resin such as silicone gel in the hollow region 100, it is desirable to suppress sounds produced by the vibrations of the exciter film 30 and the diaphragm 40.

Figure 6:
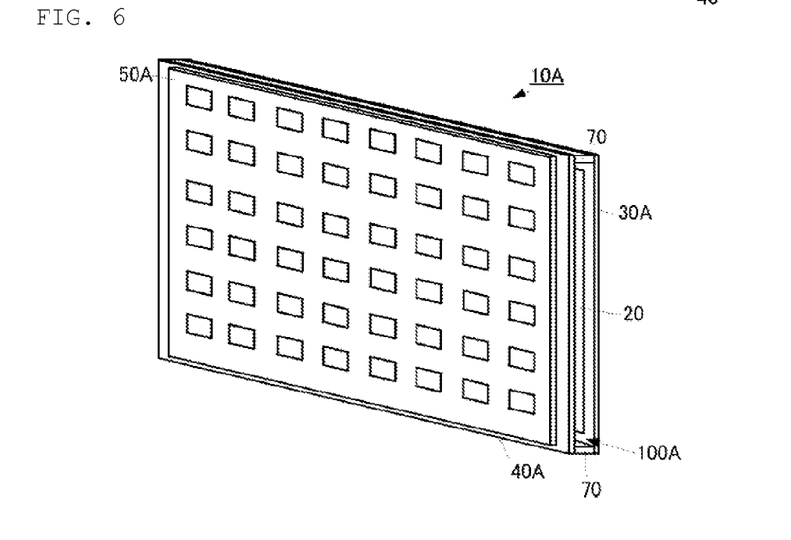
FIG. 6 is an external appearance perspective view of a tactile sense presentation device 10A.
Figure 7A:
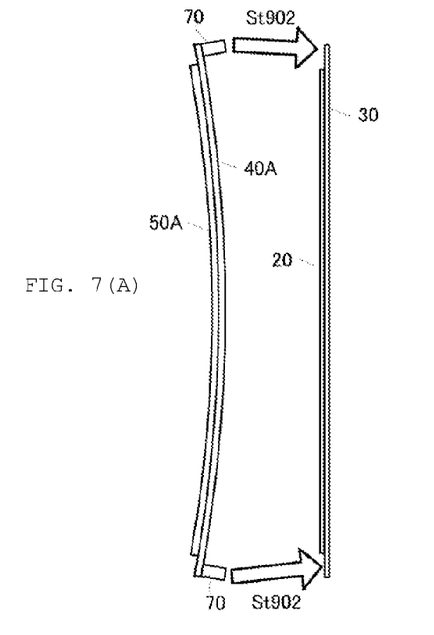
FIGS. 7(A) and 7(B) are explanatory views of a structure of the tactile sense presentation device 10A.

Next, a tactile sense presentation device according to a second embodiment will be described. FIG. 6 is an external appearance perspective view of a tactile sense presentation device 10A according to the second embodiment. FIG. 7(A) illustrates a state where a diaphragm 40A is not yet fixed, and FIG. 7(B) is an explanatory view of a structure illustrating a state where the diaphragm 40A has been fixed.

The tactile sense presentation device 10A according to the second embodiment differs from a tactile sense presentation device 10 according to the first embodiment in that an end of the diaphragm 40A is fixed to an exciter film 30 via a frame 70 such that a principal surface of the diaphragm 40A and a principal surface of the exciter film 30 are parallel. Further, in this example, a piezoelectric film 20 is attached to a front surface side of the exciter film 30. Other components are the same as those of the tactile sense presentation device 10.

The diaphragm 40A is made of the same material as that of a diaphragm 40 according to the first embodiment, and has a curved shape in a state where the diaphragm 40A is not fixed to the exciter film 30 as illustrated in FIG. 7(A). This shape can be realized by, for example, bending a diaphragm having flat principal surfaces by heat processing or the like.

Figure 7B:
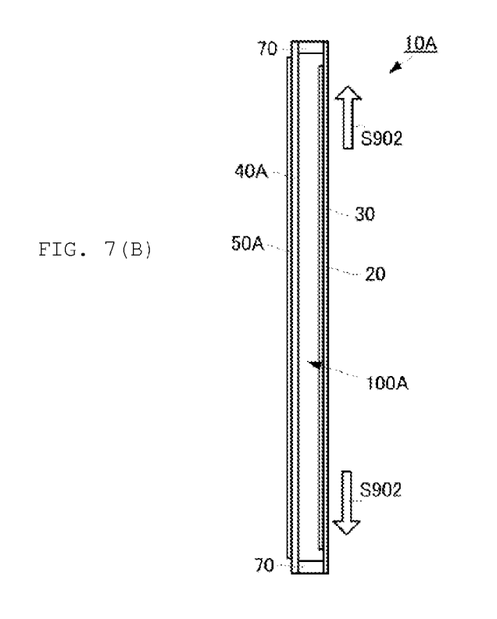

The diaphragm 40A is fixed to the exciter film 30 via the frame 70 such that the curved flat surface becomes flat as illustrated in FIG. 7(B) while a bending force is applied to both ends as indicated by an outlined arrow St902 in FIG. 7(A). When the diaphragm 40A is fixed to the exciter film 30 in such a state, a bending stress is produced on the diaphragm 40A similar to the first embodiment. Further, as indicated by a bold arrow S902 in FIG. 7(B), the exciter film 30 is pulled toward a fixed end direction from a center of a direction orthogonal to both end sides which are parallel to the principal surfaces and at which the diaphragm 40A is fixed.

Even this configuration can provide the same function and effect as those of the above first embodiment. Further, by using the configuration according to the present embodiment, it is possible to fix the principal surfaces of the diaphragm 40A in a flat state. Consequently, it is possible to attach a touch panel 50A to the diaphragm 40A in a flat state as well.

Figure 8:
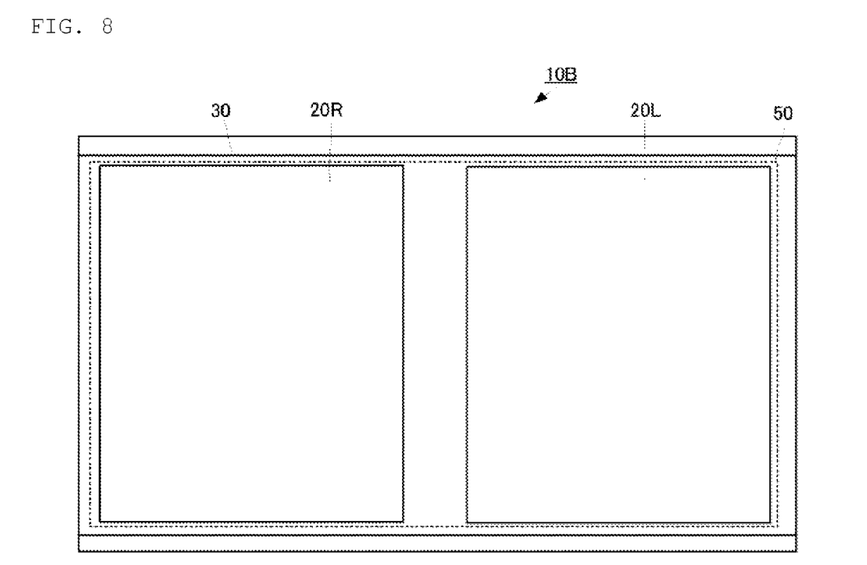
FIG. 8 is a back view of a tactile sense presentation device 10B.

Next, a tactile sense presentation device according to a third embodiment will be described with reference to the drawings. FIG. 8 is a view illustrating a tactile sense presentation device 10B according to the third embodiment seen from a back surface side. The tactile sense presentation device 10B differs from a tactile sense presentation device 10 according to the first embodiment in that a piezoelectric film 20 is divided into a plurality of (two in this case) a piezoelectric film 20R and a piezoelectric film 20L. Other components are the same as those of the tactile sense presentation device 10.

In this case, it is possible to individually drive the piezoelectric film 20R and the piezoelectric film 20L. For example, it is possible to apply drive signals of reverse phases to the piezoelectric film 20R and the piezoelectric film 20L. In addition, the number of piezoelectric films may be multiple (three, for example). When a plurality of piezoelectric films is attached, it is possible to reduce variations of vibrations resulting from positions of touch sensors 80 provided to a touch panel 50 by adjusting an operation of each film.

Figure 9:
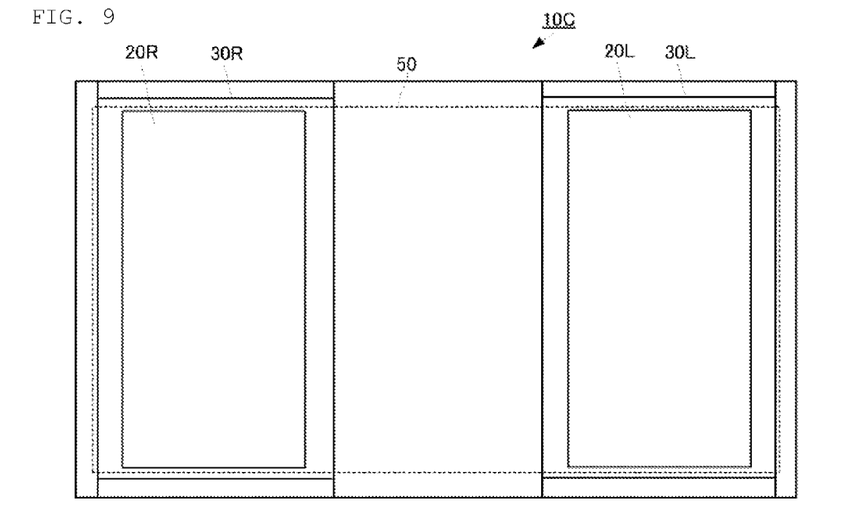
FIG. 9 is a back view of a tactile sense presentation device 10C.

FIG. 9 is a view illustrating a tactile sense presentation device 10C according to the fourth embodiment seen from a back surface side. A tactile sense presentation device 10C differs from a tactile sense presentation device 10B according to the third embodiment in that an exciter film 30 is divided into a plurality of (two in this example) an exciter film 30R and an exciter film 30L, and a piezoelectric film 20R and a piezoelectric film 20L are attached to the exciter film 30R and the exciter film 30L, respectively. Other components are the same as those of the tactile sense presentation device 10B.

In this case, it is possible to individually stretch or contract the exciter film 30R and the exciter film 30L. By, for example, applying drive signals of reverse phases to the piezoelectric film 20R and the piezoelectric film 20L, it is possible to deform the exciter film 30R and the exciter film 30L in opposite directions, respectively. When a plurality of exciter films is attached, it is possible to reduce variations of vibrations resulting from positions of touch sensors 80 provided to a touch panel 50 by adjusting an operation of each film. Further, when a plurality of exciter films is attached, an extended wiring conductor which is not illustrated or a part such as a circuit which supplies a drive signal can be disposed in a hollow region of a non-attachment portion of the exciter films, so that it is possible to make a tactile sense presentation device compact.

Figure 10A:
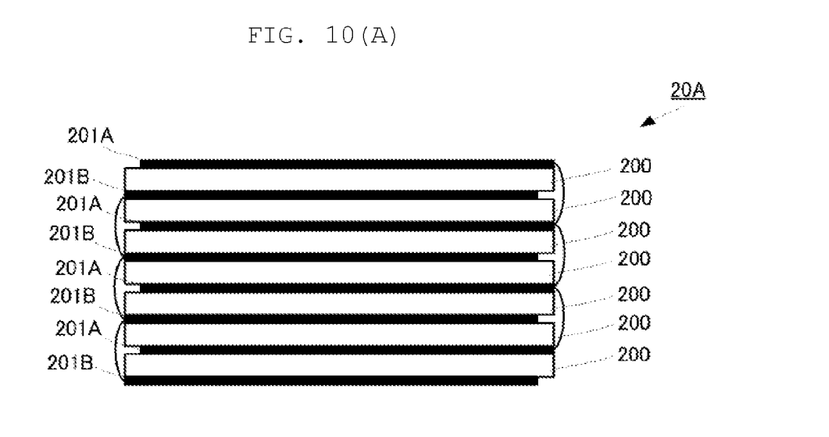
FIGS. 10(A) and 10(B) are sectional views of a piezoelectric film according to a modified example.

Next, FIG. 10(A) is a side view of a piezoelectric film 20A according to a modified example of a piezoelectric film 20. The piezoelectric film 20 illustrated in FIG. 3 adopts a structure in which one base film 200 is sandwiched by an electrode 201A and an electrode 201B. However, the piezoelectric film 20A illustrated in FIG. 10(A) adopts a structure in which a plurality of base films 200, a plurality of electrodes 201A and a plurality of electrodes 201B are laminated. In this example, the electrodes 201A and the electrodes 201B are alternately disposed across each base film 200. By laminating a plurality of base films 200, a plurality of electrodes 201A and a plurality of electrodes 201B in this way, it is possible to further enhance stretching capability and cause stronger vibrations.

Figure 10B:
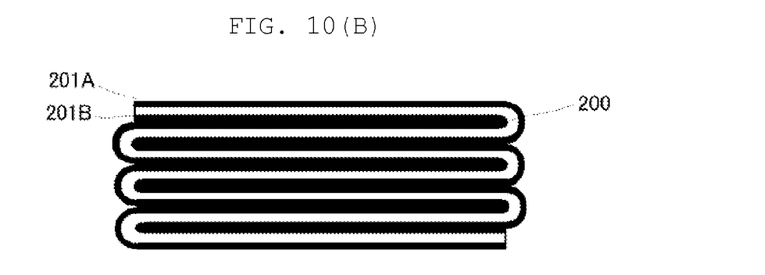

Meanwhile, FIG. 10(B) is a side view of a piezoelectric film 20B according to modified example 2. The piezoelectric film 20B illustrated in FIG. 10(B) adopts a laminated structure which is realized by sandwiching one base film 200 between the electrode 201A and the electrode 201B and bending and overlaying these base film 200, electrode 201A and electrode 201B. In this modified example, it is possible to further enhance stretching capability and cause strong vibrations. However, in this modified example, it is preferable to reinforce the electrical connections by applying a conductive paste to portions at which the electrodes are bent.

Figure 11:
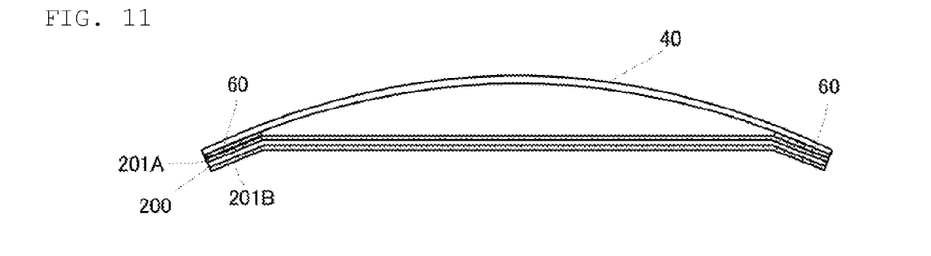
FIG. 11 is a sectional view illustrating a mode that a piezoelectric film and a diaphragm are connected.

In addition, in the above embodiments, an example where a film member is formed by the piezoelectric film 20 and the exciter film 30 has been described above. However, the exciter film 30 can be omitted. As illustrated in FIG. 11, for example, the electrode 201A of the piezoelectric film 20 and a diaphragm 40 may be connected by an adhesion layer 60 to fix the diaphragm 40. In this case, the piezoelectric film 20 corresponds to a film member according to embodiments of the present invention.

Figure 12A:
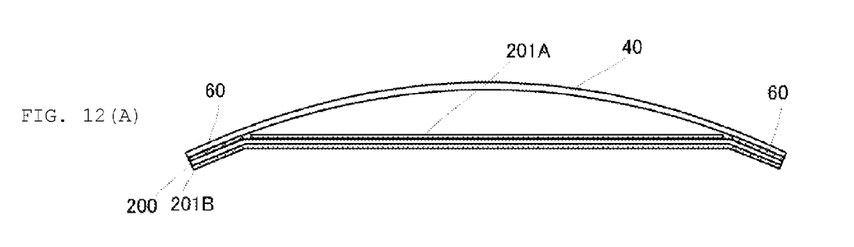
FIGS. 12(A) to 12(C) are sectional views illustrating a mode that the piezoelectric film and the diaphragm are connected.
Figure 12B:
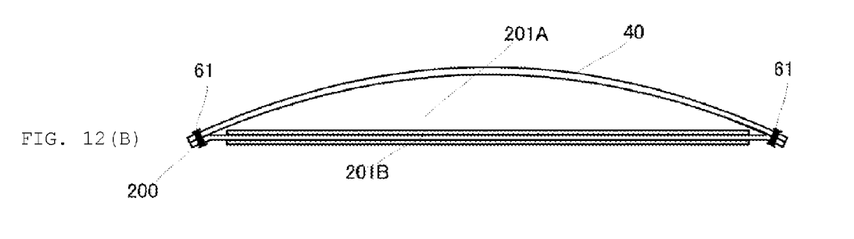
Figure 12C:
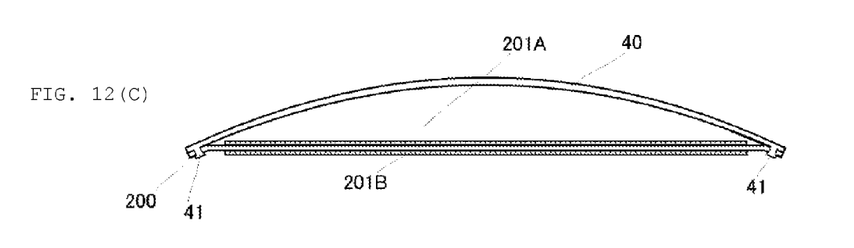

Further, a manner of connecting the piezoelectric film 20 and the diaphragm 40 may be one illustrated in FIGS. 12(A) to 12(C). As illustrated in FIG. 12(A), for example, the diaphragm 40 may be connected to a portion of the piezoelectric film 20 at which the electrode 201A is not formed. In this case, the diaphragm 40 is connected to the base film 200 via the adhesion layer 60.

In an example in FIG. 11, the diaphragm 40 is connected to the electrode 201A via the adhesion layer 60, and therefore, when the base film 200 stretches or contracts, a mechanical load is produced in the electrode 201A. Generally, each electrode is formed by way of physical joining such as deposition, and therefore has a lower joining strength compared to chemical joining for which an adhesive or the like is used. Hence, the base film 200 and the electrode 201A are likely to peel. However, in the structure in FIG. 12(A), the diaphragm 40 is not connected to the electrode 201A, and therefore a mechanical load is not produced in the electrode 201A. Hence, the structure in FIG. 12(A) can prevent the electrode from being peeled. Further, the structure in FIG. 12(A) can insulate the base film 200 when the diaphragm 40 is a conductor and, consequently, provides an advantage that, even when, for example, the diaphragm is charged by electrostatic electricity while the tactile sense presentation device is operated, a load is not applied to the base film 200.

Next, a structure in FIG. 12(B) shows the diaphragm 40 and the piezoelectric film 20 connected by fixtures 61. In this example, through-holes are made in the diaphragm 40 and the piezoelectric film 20, and then the diaphragm 40 and the piezoelectric film 20 are mechanically fixed by inserting the fixtures 61 of rivet shapes in the through-holes. The shape of each fixture 61 is preferably a columnar shape, and may be another shape such as a prismatic shape. In this regard, when the fixtures 61 are conductors, electrodes around the through-holes are desirably removed such that the fixtures 61 do not contact the electrodes. When the electrodes are laminated as illustrated in FIG. 10, it is preferable to remove all electrodes around the through-holes in each layer. In addition, when electrodes are laminated, and when, for example, the electrode 201A is removed in a first layer, only electrodes which are connected to the electrode 201A of the first layer and have same potentials need to be removed in second and subsequent layers. Naturally, when the fixtures 61 are insulating bodies, electrodes do not need to be removed.

A structure in FIG. 12(C) shows protrusions 41 provided on the diaphragm 40 and the protrusions 41 are inserted in through-holes in the piezoelectric film 20. Each protrusion 41 has the same function as that of the fixture 61 illustrated in FIG. 12(B).

Figure 13A:
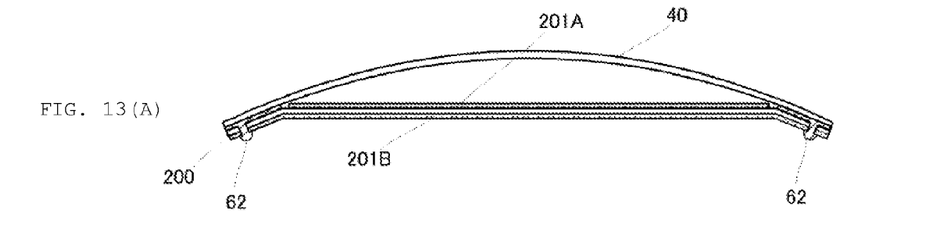
FIGS. 13(A) and 13(B) are sectional views illustrating a mode that the piezoelectric film and the diaphragm are connected.

A structure in FIG. 13(A) shows the diaphragm 40 connected to the base film 200 via the adhesion layer 60 and the adhesion layer 60 is further filled in the through-holes of the base film 200. In this case, it is also possible to prevent the electrodes from being peeled.

Figure 13B:
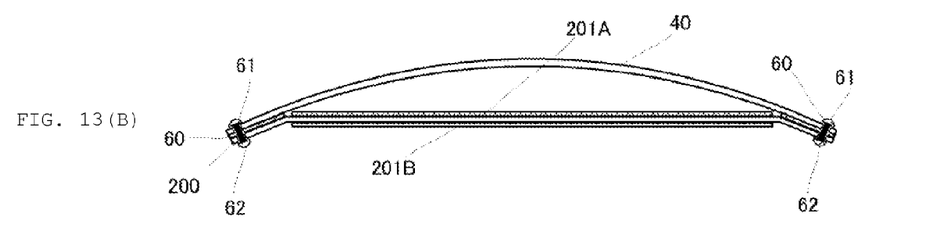

A structure in FIG. 13(B) shows through-holes in the diaphragm 40 and the piezoelectric film 20, that fixtures 61 having rivet shapes are inserted in the through-holes, the adhesion layer 60 is filled in the through-holes and the diaphragm 40 is connected to the base film 200 via the adhesion layer 60. In this case, the diaphragm 40 and the piezoelectric film 20 are fixed the most strongly.

Figure 14A:
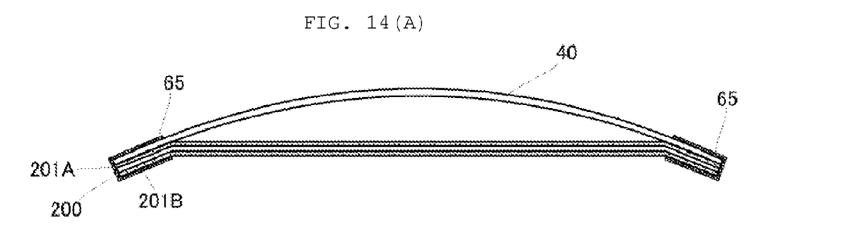
FIGS. 14(A) to 14(C) are sectional views illustrating a mode that the piezoelectric film and the diaphragm are connected by using holding members.

A structure in FIG. 14(A) shows the diaphragm 40 and the piezoelectric film 20 sandwiched by holding members 65. Each holding member 65 is formed by bending a thin flat member of a rectangular shape 90 degrees at two portions. A bent inner surface of each holding member 65 comes into contact with the diaphragm 40 and the electrode 201B to sandwich the diaphragm 40 and the piezoelectric film 20.

Figure 14B:
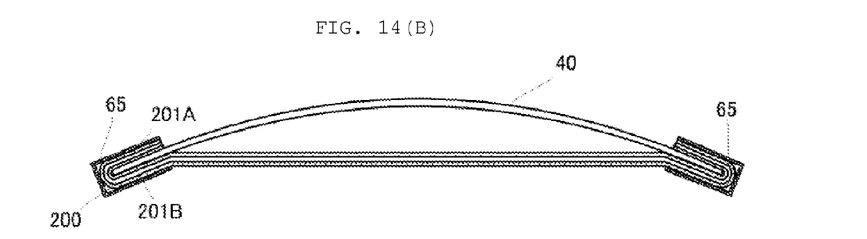

Further, as illustrated in FIG. 14(B), the diaphragm 40 and the piezoelectric film 20 may be fixed by bending the piezoelectric film 20, entangling the piezoelectric film 20 at a top surface side of the diaphragm 40 and sandwiching the entangled piezoelectric film 20 by the holding member 65.

Figure 14C:
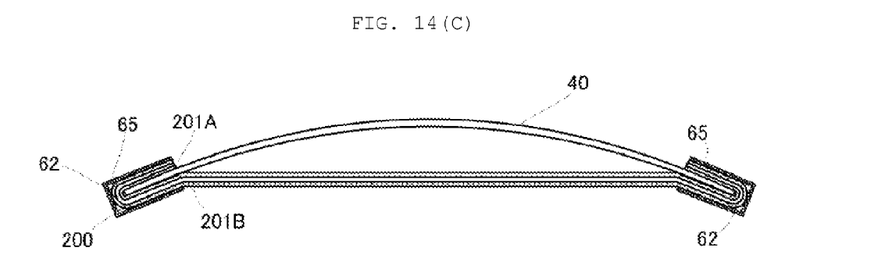

Further, as illustrated in FIG. 14(C), adhesives 62 may be filled in inner surfaces of the holding members 65 to fix the diaphragm 40 and the piezoelectric film 20 more strongly.

In addition, the structures illustrated in FIGS. 12(A) to 14(C) are the same even when a plurality of piezoelectric films is attached. Particularly, when a plurality of piezoelectric films is attached, it is possible to reduce variations of vibrations resulting from positions of touch sensors 80 provided to a touch panel 50 by adjusting an operation of each film. Further, when a plurality of piezoelectric films is attached, an extended wiring conductor which is not illustrated or a part such as a circuit which supplies a drive signal can be disposed in a hollow region of a non-attachment portion of the piezoelectric films, so that it is possible to make a tactile sense presentation device compact.

In addition, "the film member" according to the present invention "which deforms in the planar direction when a voltage is applied thereto" is not limited to a piezoelectric film. The film member can include an electrostrictive film, an erectret film, a composite film or an electroactive film.

The electroactive film is a film member which is electrically driven to produce a stress, or a film member which is electrically driven to be deformed and cause displacement. More specifically, the electroactive film includes an electrostrictive film, a composite material (a material formed by sealing piezoelectric ceramics with resin), an electrically driving elastomer or a liquid crystal elastomer.

Further, the film member can be realized by using piezoelectric ceramics and a plurality of exciter films. In this case, one end of each of a plurality of exciter films is connected to the piezoelectric ceramics, and the other end is connected to the diaphragm.

DESCRIPTION OF REFERENCE SYMBOLS

10 TACTILE SENSE PRESENTATION DEVICE
20 PIEZOELECTRIC FILM
30 EXCITER FILM
40 DIAPHRAGM
50 TOUCH PANEL
60 ADHESION LAYER
70 FRAME
80 TOUCH SENSOR
81 VOLTAGE DRIVER

The invention claimed is:

1. A tactile sense presentation device comprising:
a film member which deforms in a planar direction when a voltage is applied thereto;
a diaphragm fixed to the film member in a state where a bending stress is applied to the diaphragm;
a touch detector which detects a touch operation; and
a voltage driver which applies a drive signal to the film member when the touch detector detects the touch operation.

2. The tactile sense presentation device according to claim 1, wherein the diaphragm is fixed to a portion of the film member that does not include an electrode.

3. The tactile sense presentation device according to claim 1, further comprising an adhesive which adheres the diaphragm and the film member.

4. The tactile sense presentation device according to claim 1, wherein the touch detector includes a touch panel attached to the diaphragm.

5. The tactile sense presentation device according to claim 1, wherein the diaphragm is fixed to the film member in a state where the diaphragm is curved in a direction orthogonal to a principal surface of the film member.

6. The tactile sense presentation device according to claim 1, wherein a surface of the diaphragm is curved in a state where the diaphragm is not fixed to the film member, and, when the diaphragm is fixed to the film member the surface is flat.

7. The tactile sense presentation device according to claim 1, wherein a plurality of film members are attached to the diaphragm.

8. The tactile sense presentation device according to claim 1, wherein the film member comprises a plurality of electrodes and a plurality of piezoelectric resins laminated together.

9. The tactile sense presentation device according to claim 1, wherein the diaphragm is fixed to the film member via a fixture.

10. The tactile sense presentation device according to claim 9, wherein the fixture fixes the diaphragm to the film member via a hole in the film member.

11. The tactile sense presentation device according to claim 9, wherein the fixture fixes the diaphragm to the film member by sandwiching the film member and the diaphragm.

12. The tactile sense presentation device according to claim 1, wherein
the film member includes a piezoelectric film, and an exciter film attached to the piezoelectric film, and
the diaphragm is fixed to the film member via the exciter film.

13. The tactile sense presentation device according to claim 12, wherein the piezoelectric film is polyvinylidene fluoride.

14. The tactile sense presentation device according to claim 12, wherein the piezoelectric film is a chiral polymer.

15. The tactile sense presentation device according to claim 14, wherein the chiral polymer is polylactic acid.

* * * * *